(12) United States Patent
Ito et al.

(10) Patent No.: US 7,148,735 B2
(45) Date of Patent: Dec. 12, 2006

(54) LEVEL SHIFTER HAVING AUTOMATIC DELAY ADJUSTING FUNCTION

(75) Inventors: Miwa Ito, Osaka (JP); Kazuyuki Nakanishi, Osaka (JP); Akio Hirata, Kyoto (JP); Hiroo Yamamoto, Osaka (JP); Tsuguyasu Hatsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/191,009

(22) Filed: Jul. 28, 2005

(65) Prior Publication Data

US 2005/0258887 A1  Nov. 24, 2005

Related U.S. Application Data

(63) Continuation of application No. 10/762,336, filed on Jan. 23, 2004, now abandoned.

(30) Foreign Application Priority Data

Jan. 31, 2003  (JP) .............................. 2003-024449

(51) Int. Cl.
*H03L 5/00* (2006.01)
(52) U.S. Cl. ......................... 327/333; 326/81
(58) Field of Classification Search ................ 327/333; 326/68, 80, 81
See application file for complete search history.

(56) References Cited

U.S. PATENT DOCUMENTS

| | | | | |
|---|---|---|---|---|
| 5,321,324 A | * | 6/1994 | Hardee et al. | ................. 326/80 |
| 5,583,454 A | | 12/1996 | Hawkins et al. | ............... 326/81 |
| 5,896,044 A | * | 4/1999 | Walden | ........................ 326/80 |
| 6,784,718 B1 | * | 8/2004 | Okamoto et al. | ........... 327/333 |
| 2003/0001554 A1 | | 1/2003 | Park | ........................... 323/315 |

FOREIGN PATENT DOCUMENTS

| | | |
|---|---|---|
| JP | 3070373 | 5/1926 |
| JP | 11-41090 | 2/1999 |
| JP | 2000-091894 A | 3/2000 |

* cited by examiner

*Primary Examiner*—Long Nguyen
(74) *Attorney, Agent, or Firm*—McDermott Will & Emery LLP

(57) ABSTRACT

In a level shifter, in the case where the amplitude voltage of an input signal (i.e., a first power voltage VDDL) input to an input terminal is changed to be higher and the amplitude voltage of an output signal (i.e., a second power voltage VDDH) output from an output terminal is changed to be lower, a fall delay time of the signal output from the output terminal tends to be longer than a rise delay time of the signal. However, an inverted input signal obtained by an inverter is input to a level shifting unit and also to the gate of an N-type transistor, and therefore, the N-type transistor is turned on at the fall of the input signal input to the input terminal, so as to supply a current based on the second power voltage VDDH to an output node of the level shifting unit for assisting the shift into H level performed in the level shifting unit. Accordingly, even when at least one of the amplitude voltage of the input signal and the amplitude voltage of the output signal is changed, balance between the fall delay time characteristic and the rise delay time characteristic of the output signal can be satisfactorily kept.

2 Claims, 12 Drawing Sheets

PRIOR ART    FIG. 15

PRIOR ART FIG. 16
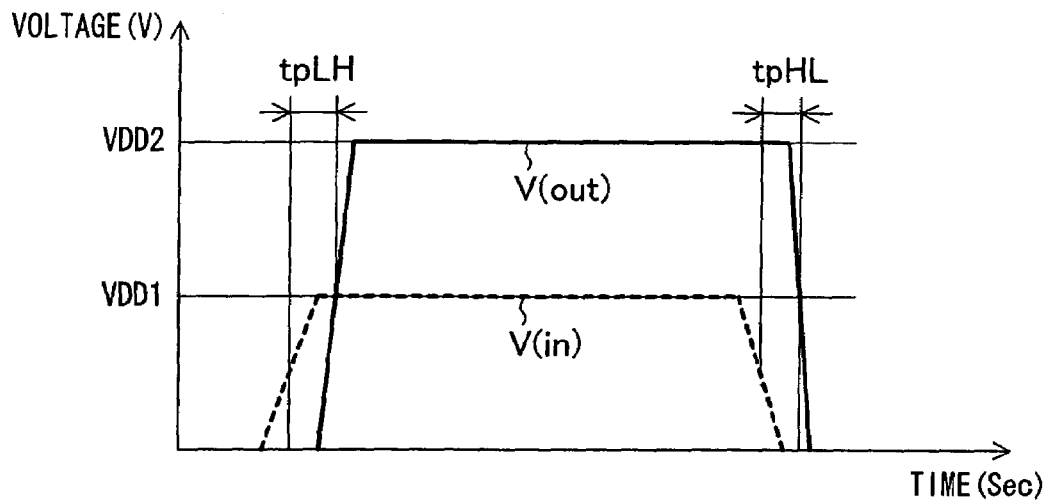
PRIOR ART FIG. 17
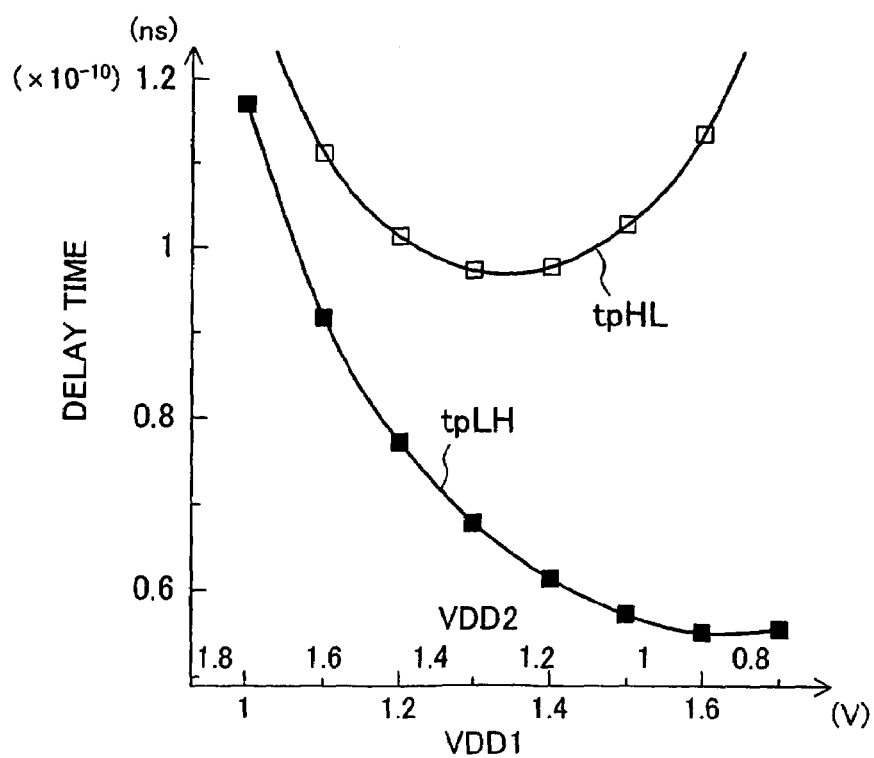

LEVEL SHIFTER HAVING AUTOMATIC DELAY ADJUSTING FUNCTION

RELATED APPLICATION

This application is a continuation of Application No. 10/762,336 filed Jan. 23, 2004, now abandoned, which claims priority of Japanese application Serial No. JP 2003-024449, filed Jan. 31, 2003, and the contents of which are hereby incorporated by reference.

BACKGROUND OF THE INVENTION

The present invention relates to a level shifter disposed between two logic circuits respectively driven by different power voltages for shifting the voltage level of an output signal of one of the logic circuits to supply the shifted voltage to the other logic circuit.

Recently, portable equipment to which power is supplied from batteries have been widely spread, and in order to elongate the driving time of the batteries, it is earnestly required to reduce the power consumption of a system used in such portable equipment. On the other hand, among these portable equipment, particularly cellular phones are required to have a large number of functions for, for example, e-mails, web browsing and games apart from its original communication function. Therefore, in a semiconductor integrated circuit included in such portable equipment, power voltages are changed in respective blocks therein in accordance with requested functions, so as to lower the power voltage in a block that is not required of a high speed operation. Thus, multifunctional performance and low power consumption are both attained. As a result, in some cases, power voltages are different in the respective internal blocks having different functions, and hence, it is necessary to provide a level shifter for shifting a signal level between these functional blocks.

A conventional general signal level shifter will now be described with reference to FIGS. 15 and 16. FIG. 15 is a diagram for showing the configuration of the level shifter and FIG. 16 is a diagram for showing its input waveform and output waveform.

In the level shifter shown in FIG. 15, when an input signal V(in) at an internal voltage level VDD1 is input, an output signal V(out) having been shifted in the level into an external voltage level VDD2 is output from an output terminal out as shown in FIG. 16. It is noted, in FIG. 16, that tpLH indicates a delay time from the rise of the input signal V(in) to the rise of the output signal V(out) and tpHL indicates a delay time from the fall of the input signal V(in) to the fall of the output signal V(out).

First, the change of the output signal V(out) caused when the input signal V(in) input from an input terminal in rises from 0 V to the internal voltage level VDD1 will be described. The internal voltage level VDD1 of the input signal V(in) is transferred to an inverter I1. The inverter I1 outputs a signal at L (0 V) level, and an inverter I2 outputs a signal at the internal voltage level VDD1. An input voltage to the gate of an NMOS transistor N1 becomes the internal voltage level VDD1, and therefore, the NMOS transistor N1 is turned on, and an input voltage to the gate of another NMOS transistor N2 becomes 0 V, and hence, the NMOS transistor N2 is turned off. As a result, an input voltage to the gate of a PMOS transistor P2 and an inverter I3 changes from the external voltage level VDD2 to 0 V, and hence, the output voltage of the inverter I3 is changed from 0 V to the external voltage level VDD2. At this point, since the PMOS transistor P2 is gradually turned on, the input voltage to the gate of a PMOS transistor P1 is changed from 0 V to the external voltage level VDD2, and hence the PMOS transistor P1 is turned off.

Next, the change of the output signal V(out) caused when the input signal V(in) input from the input terminal in falls from the internal voltage level VDD1 to 0 V will be described. In this case, the inverter I1 outputs a signal at the internal voltage level VDD1 and the inverter I2 outputs a voltage of 0 V. The input voltage to the gate of the NMOS transistor N1 becomes 0 V, and hence the NMOS transistor N1 is turned off, and the input voltage to the gate of the NMOS transistor N2 becomes the internal voltage level VDD1, and hence the NMOS transistor N2 is turned on. As a result, the input voltage to the gate of the PMOS transistor P1 is changed from the external voltage level VDD2 to 0 V. At this point, the PMOS transistor P1 is gradually turned on, and therefore, the input voltage to the gate of the PMOS transistor P2 and the inverter I3 is changed from 0 V to the external voltage level VDD2, and the PMOS transistor P2 is turned off. The output voltage of the inverter I3, namely, the output signal from the output terminal out, is changed from the external voltage level VDD2 to 0 V.

In the aforementioned operation, assuming that the voltage level of the input signal V(in), the power voltage levels VDD1 and VDD2 and the voltage level of the output signal V(out) are respectively set to predetermined fixed values, the design parameters such as the gate length and the gate width of each MOS transistor are optimized, so that the level shifter attains optimum rise and fall delay characteristics.

In the conventional level shifter, however, when the internal voltage level VDD1 and the external voltage level VDD2 are changed, a large time difference is caused between the rise delay time tpLH and the fall delay time tpHL of the output signal, and therefore, these delay times are disadvantageously ill balanced. The changes of the delay times caused in changing the power voltages are shown in FIG. 17. Specifically, FIG. 17 shows the characteristics of the rise delay time tpLH and the fall delay time tpHL of the output signal obtained when the internal power voltage level VDD1 and the external power voltage level VDD2 are changed. In this drawing, as the internal power voltage level VDD1 is changed to be higher, the rise delay time tpLH becomes shorter, and as the external power voltage level VDD2 is changed to be lower, the fall delay time tpHL becomes shorter and halfway (at approximately 1.35 V in this drawing) becomes longer. Accordingly, as the internal power voltage level VDD1 is set to be higher and the external power voltage level VDD2 is set to be lower, the balance between the delay times is more largely spoiled.

A technique to overcome this problem is described in, for example, Japanese Laid-Open Patent Publication No. 11-41090. In this publication, in order to make the rise and fall delay times well balanced, a control signal is externally generated to be input to a level shifter, so that the characteristics of the rise and fall delay times of the level shifter can be changed.

In this conventional level shifter, however, it is necessary to externally input a control signal to the level shifter, and therefore, the circuit scale of the whole semiconductor integrated circuit including the level shifter is increased. Accordingly, the number of wires is increased, resulting in disadvantageously complicating the whole circuit.

SUMMARY OF THE INVENTION

An object of the invention is, in a level shifter, automatically adjusting balance between rise and fall delay times of an output signal without externally inputting a control signal even when one or both of a power voltage on the input side and a power voltage on the output side are changed.

In order to achieve the object, according to this invention, in the case of imbalance in which, for example, the rise delay time of an output signal resulting from level shift is longer than the fall delay time, the balance between the delay times is corrected by automatically compensating the quantity of a current supplied as the output signal to be increased so as to reduce the rise delay time, or by automatically increasing the fall delay time of the output signal.

Specifically, the level shifter having an automatic delay adjusting function of this invention includes an input terminal to which an input signal having a first amplitude voltage corresponding to potential difference between a first power voltage and a given voltage is input; a level shifting unit for level-shifting the first amplitude voltage of the input signal input to the input terminal into a second amplitude voltage corresponding to potential difference between a second power voltage and the given voltage; an output terminal for outputting an output signal resulting from shift performed by the level shifting unit; and an automatic delay adjusting circuit for automatically correcting balance between a rise delay time and a fall delay time of the output signal that results from the shift by the level shifting unit and is output from the output terminal in accordance with change of a voltage value of at least one of the first power voltage and the second power voltage.

In one aspect of the level shifter having an automatic delay adjusting function, the automatic delay adjusting circuit compensatively increases the quantity of a current flowing to the output terminal when the rise delay time of the output signal output from the output terminal is longer than the fall delay time.

In another aspect of the level shifter having an automatic delay adjusting function, the automatic delay adjusting circuit includes an N-type transistor, and the second power voltage is supplied to one end of the N-type transistor, the other end thereof is connected to the output terminal and a gate thereof is connected to the input terminal.

In still another aspect of the level shifter having an automatic delay adjusting function, the automatic delay adjusting circuit further includes a P-type transistor, and a drain of the P-type transistor is connected to a source of the N-type transistor, the first power voltage is supplied to a source thereof and the second power voltage is supplied to a gate thereof.

In another aspect of the level shifter having an automatic delay adjusting function, the automatic delay adjusting circuit includes a current mirror circuit, the current mirror circuit includes a first N-type transistor and first and second P-type transistors, the given voltage is supplied to a source of the first N-type transistor, a drain thereof is connected to gates of the first and second P-type transistors and a gate thereof is connected to the input terminal, a drain of the first P-type transistor is connected to the drain of the first N-type transistor and the second power voltage is supplied to a source thereof, and a drain of the second P-type transistor is connected to the output terminal and the second power voltage is supplied to a source thereof.

In another aspect, the level shifter having an automatic delay adjusting function further includes an inverter for inverting the signal resulting from the shift performed by the level shifting unit and for outputting an inverted signal to the output terminal, the current mirror circuit further includes a second N-type transistor, and a source of the second N-type transistor is connected to the drain of the first N-type transistor, a drain thereof is connected to the drain of the first P-type transistor and a gate thereof is connected between the inverter and the output terminal.

In another aspect of the level shifter having an automatic delay adjusting function, the automatic delay adjusting circuit compensatively reduces lowering of a voltage on the side of the input terminal of the level shifting unit or a voltage on the side of the output terminal of the level shifting unit when the rise delay time of the output signal output from the output terminal is longer than the fall delay time.

In another aspect of the level shifter having an automatic delay adjusting function, the automatic delay adjusting circuit includes serially connected first and second N-type transistors, a gate of the first N-type transistor is connected to the input terminal and a drain thereof is connected to a signal input side of the level shifting unit, and the given voltage is supplied to a source of the second N-type transistor, a drain thereof is connected to a source of the first N-type transistor and the second power voltage is supplied to a gate thereof.

In another aspect of the level shifter having an automatic delay adjusting function, the automatic delay adjusting circuit includes serially connected first and second N-type transistors, a gate of the first N-type transistor is connected to a signal output side of the level shifting unit and a drain thereof is connected to the output terminal, and a drain of the second N-type transistor is connected to a source of the first N-type transistor, the given voltage is supplied to a source thereof and the first power voltage is supplied to a gate thereof.

In another aspect of the level shifter having an automatic delay adjusting function, the level shifting unit is a cross latch type shifter including first and second P-type transistors and third and fourth N-type transistors, a drain of one of the first and second P-type transistors is connected to a drain of the other P-type transistor and a drain of the second P-type transistor is connected to the output terminal, a gate of the third N-type transistor is connected to the input terminal and the given voltage is supplied to a source thereof, and a gate of the fourth N-type transistor is connected to the input terminal through an inverter and the given voltage is supplied to a source thereof, the automatic delay adjusting circuit includes a fifth N-type transistor, and a drain of the fifth N-type transistor is connected to the source of the fourth N-type transistor, the given voltage is supplied to a source thereof and the second power voltage is supplied to a gate thereof.

In another aspect of the level shifter having an automatic delay adjusting function, the automatic delay adjusting circuit further includes a sixth N-type transistor, and a drain of the sixth N-type transistor is connected to the source of the third N-type transistor, the given voltage is supplied to a source thereof and the first power voltage is supplied to a gate thereof.

In another aspect of the level shifter having an automatic delay adjusting function, the level shifting unit is a cross latch type shifter including first and second P-type transistors and first and second N-type transistors, a drain of one of the first and second P-type transistors is connected to a gate of the other P-type transistor and a drain of the second P-type transistor is connected to the output terminal, and a gate of the first N-type transistor is connected to the input terminal and the given voltage is supplied to a source thereof, and a gate of the second N-type transistor is connected to the input terminal through an inverter and the given voltage is supplied to a source thereof.

For example, in the case where the rise delay time and the fall delay time of an output signal from an output terminal are set to be substantially the same time when a voltage level is shifted to be higher, if the voltage level is shifted to be lower due to change of first and second power voltages, the rise delay time becomes longer than the fall delay time. However, in the level shifter having the automatic delay adjusting function of this invention, the automatic delay adjusting circuit automatically corrects imbalance between the delay times even in such a case, so that an input signal can be level-shifted always with appropriate delay characteristics regardless of the values of the power voltages attained before and after the level shift.

For example, in this invention, although the rise delay time of the output signal from the level shifting unit tends to be increased in such a case, the automatic delay adjusting circuit makes a large current flow to the output terminal so as to compensate the voltage increase of the output signal, and hence, the rise delay time is reduced to be balanced with the fall delay time. In particular, in this invention, when it is necessary to compensate the delay times because the imbalance between the rise and fall delay times is large, namely, merely when the second power voltage is lower than the first power voltage, the P-type transistor is turned on so as to allow a large current to flow to the output terminal. Furthermore, in this invention, a large current is allowed to flow to the output terminal by using the current mirror circuit, the rise delay time can be effectively reduced. In addition, in this invention, the second N-type transistor is turned off when the output signal from the output terminal has undergone a transition to H level, and therefore, a steady state current flowing from the current mirror circuit can be cut so as to reduce the power consumption.

Moreover, in this invention, when the rise delay time of the output signal becomes longer than the fall delay time, the fall of the input signal to the level shifting unit is slowed so as to increase the fall delay time of the output signal, or the rise of the output signal from the level shifting unit is shortened so as to reduce the rise delay time of the output signal. Thus, the balance between the rise delay time and the fall delay time can be satisfactorily kept.

BRIEF DESCRIPTION OF THE DRAWINGS

FIG. 15 is a circuit diagram for showing the configuration of a conventional level shifter;

FIG. 16 is a diagram for explaining a rise delay time and a fall delay time of an output signal in the conventional level shifter; and FIG. 17 is a diagram for showing a rise delay time characteristic and a fall delay time characteristic of the output signal obtained when a first power voltage and a second power voltage are changed in the conventional level shifter.

DETAILED DESCRIPTION OF THE INVENTION

Level shifters having an automatic delay adjusting function according to preferred embodiments of the invention will now be described with reference to the accompanying drawings.

Embodiment 1

Figure 1:
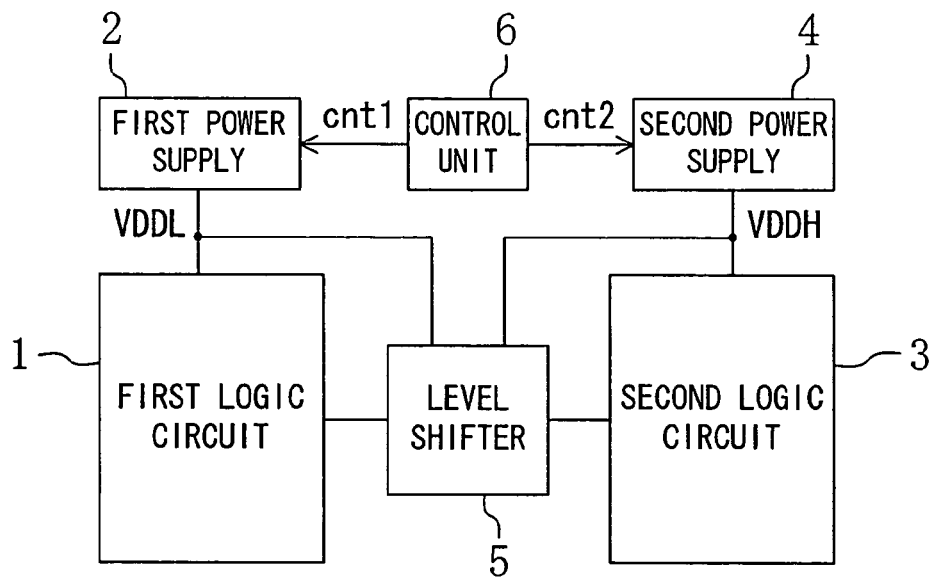
FIG. 1 is a block diagram of a system using a level shifter having an automatic delay adjusting function according to Embodiment 1 of the invention.

FIG. 1 is a block diagram of a system using a level shifter having an automatic delay adjusting function according to Embodiment 1 of the invention.

In FIG. 1, a reference numeral 1 denotes a first logic circuit, a reference numeral 2 denotes a first power supply for supplying a first power voltage VDDL, a reference numeral 3 denotes a second logic circuit, a reference numeral 4 denotes a second power supply for supplying a second power voltage VDDH, a reference numeral 5 denotes a level shifter having an automatic delay adjusting function disposed between the first logic circuit 1 and the second logic circuit 3, and a reference numeral 6 denotes a control unit for changing the first and second power voltages VDDL and VDDH of the first and second power supplies 2 and 4.

The first power voltage VDDL is supplied to the first logic circuit 1 by the first power supply 2, and the second power voltage VDDH is supplied to the second logic circuit 3 by the second power supply 4. Signals are transferred between the first logic circuit 1 and the second logic circuit 3. When the first logic circuit 1 is to be operated at a high speed, the first power voltage VDDL is set to a high voltage, and when the first logic circuit is to be operated at low power consumption, the first power voltage VDDL is set to a low voltage. Similarly, when the second logic circuit 3 is to be operated at a high speed, the second power voltage VDDH is set to a high voltage, and when the second logic circuit 3 is to be operated at low power consumption, the second power voltage VDDH is set to a low voltage. The first power voltage VDDL and the second power voltage VDDH can be independently changed respectively in accordance with control signals cnt1 and cnt2 supplied by the control unit 6.

The amplitude voltage of an output signal from the first logic circuit 1 corresponds to a potential difference between the first power voltage VDDL and a ground voltage (a given voltage), namely, the first power voltage VDDL. The level shifter 5 level-shifts the signal level (the amplitude voltage) of the output signal from the first logic circuit 1 into the second power voltage VDDH corresponding to the signal level (the amplitude voltage) of a signal in the second logic circuit 3 (i.e., the amplitude voltage corresponding to a potential difference between the second power voltage VDDH and the ground voltage). A signal that has been level-shifted by the level shifter 5 is input to the second logic circuit 3.

Although merely one signal is transferred from the first logic circuit 1 to the second logic circuit 3 in FIG. 1, a plurality of signals may be transferred between these logic circuits 1 and 3.

For example, in the case where the first power voltage VDDL is set to a low voltage and the second power voltage VDDH is set to a high voltage, when this relationship between the power voltages is changed, the balance between a rise delay time characteristic and a fall delay time characteristic is spoiled in a level shifter that is designed to have optimum delay time characteristics. In contrast, in the level shifter having the automatic delay adjusting function of this embodiment, the delay time characteristics can be improved in accordance with the voltage levels of an input signal and an output signal, and furthermore, imbalance between the delay time characteristics and increase of a delay time derived from the changes of the voltage levels of the input signal and the output signal can be avoided.

Figure 2:
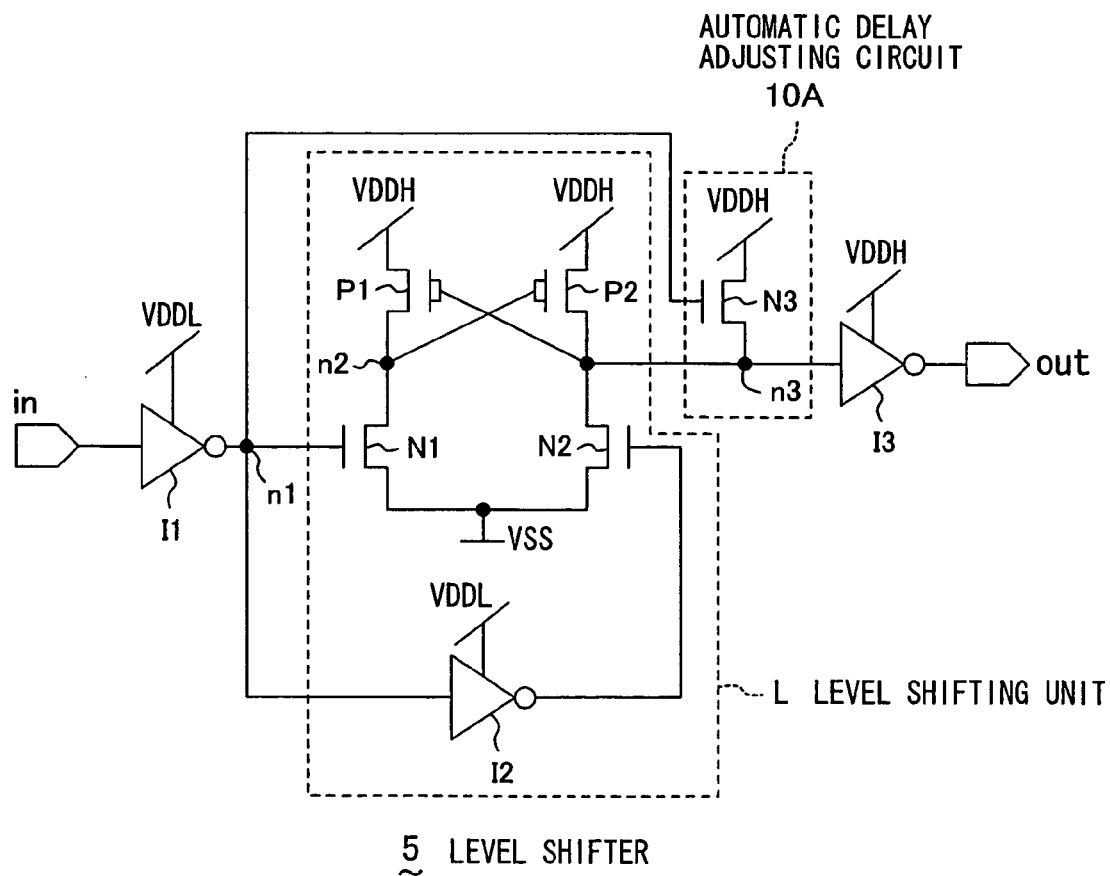
FIG. 2 is a circuit diagram for showing the internal configuration of the level shifter having the automatic delay adjusting function of Embodiment 1.

FIG. 2 is a circuit diagram for showing the internal configuration of the level shifter 5 having the automatic delay adjusting function. In FIG. 2, in indicates an input terminal, out indicates an output terminal, and L indicates a level shifting unit disposed between the terminals in and out. The output signal from the first logic circuit 1 is input to the input terminal in. The input signal entering the input terminal in is input to an input node n1 of the level shifting unit L through a first inverter I1. The first inverter I1, to which the first power voltage VDDL is supplied, inverts the level of the input signal so that the inverted signal can be at a level of the ground voltage when the input signal is the first power voltage VDDL and that the inverted signal can be at a level of the first power voltage VDDL when the input signal is the ground voltage.

The level shifting unit L is a cross latch type shifter having the internal configuration including first and second P-type MOS transistors P1 and P2, first and second N-type MOS transistors N1 and N2 and a second inverter I2. Needless to say, the transistors used in this embodiment are not limited to MOS (Metal Oxide Semiconductor) type transistors but may be MIS (Metal Insulator Semiconductor) type transistors. This also applies to each embodiment described below. The first and second P-type MOS transistors P1 and P2, to the sources of which the second power voltage VDDH is supplied, are in a cross coupled configuration in which the drain of one MOS transistor is connected to the gate of the other. The drain of the second P-type MOS transistor P2 is connected, as an output node n3, to the output terminal out through a third inverter I3 as described later.

Also, in the level shifting unit L, the gate of the first N-type MOS transistor N1 works as the input node n1 of the level shifting unit L, and an inverted input signal entering the input terminal in is input to this gate (i.e., the input node n1) through the first inverter I1. A ground voltage (a given voltage) VSS is supplied to the source of the first N-type MOS transistor N1, whose drain is connected to the drain of the first P-type MOS transistor P1, and the connecting point between these transistors corresponds to a node n2. In the second N-type MOS transistor N2, the gate thereof is connected to the input node n1 of the level shifting unit L through the second inverter I2 for receiving the input signal entering the input terminal in, the ground voltage VSS is supplied to the source thereof, the drain thereof is connected to the drain of the second P-type MOS transistor P2, and the connection point between these transistors corresponds to the output node n3 of the level shifting unit L. The second inverter I2 accepts the first power voltage VDDL and performs a signal inverting operation similar to that of the first inverter I1.

Owing to this configuration, the level shifting unit L shifts the level of a signal entering the input node n1 (namely, the level of the inverted input signal from the input terminal in) and increases the amplitude voltage of the signal (corresponding to the first power voltage VDDL) to a larger amplitude voltage (corresponding to the second power voltage VDDH). Specifically, when the signal at the input node n1 is at the level of the first power voltage VDDL, the signal level is shifted into the second power voltage VDDH, and when the signal at the input node n1 is at the level of the ground voltage VSS, the signal level is shifted into the ground voltage VSS.

The output node n3 of the level shifting unit L is connected to the output terminal out through the third inverter I3. The inverter I3 accepts the second power voltage VDDH, and shifts, without changing the amplitude voltage, the level of the signal at the output node n3 of the level shifting unit L into the second power voltage VDDH when the signal is at the level of the ground voltage VSS and into the ground voltage VSS when the signal is at the level of the second power voltage VDDH.

As a characteristic of this invention, the output node n3 of the level inverting unit L is connected to an automatic delay adjusting circuit 10A. This automatic delay adjusting circuit 10A automatically adjusts the balance between a rise delay time and a fall delay time of an output signal that results from the level shift performed by the level shifting unit L and is output from the output terminal out even when at least one of the first and second power voltages VDDL and VDDH is changed. Specifically, the automatic delay adjusting circuit 10A is composed of an N-type MOS transistor N3. The second power voltage VDDH is supplied to the source of the MOS transistor N3, the drain thereof is connected to the output node n3 of the level shifting unit L and the gate thereof is connected to the input node n1 of the level shifting unit L.

Although the first and third inverters I1 and I3 are respectively disposed before and after the input node n1 and the output node n3 of the level shifting unit L in this embodiment, these inverters I1 and I3 are not always necessary. In a basic configuration not using these inverters, the rises and the falls of the input signal and the output signal are reversed in the following description.

Now, the operation of the level shifter having the automatic delay adjusting function of this embodiment will be described. Herein, the case where the first power voltage VDDL is higher than the second power voltage VDDH will be exemplified.

In this case, in the level shifting unit L, the gate-source voltage Vgs of the P-type MOS transistor P2 is small and the gate-source voltage Vgs of the N-type MOS transistor N2 is large. Accordingly, the driving ability of the P-type MOS transistor P2 is lower as compared with that of the N-type MOS transistor N2, and hence, a fall delay time from the input signal in to the output signal out is increased as compared with a rise delay time so as to largely spoil the balance between these delay times.

However, in this embodiment, when the input signal in falls, the N-type MOS transistor N3 of the automatic delay adjusting circuit 10A is turned on, so as to apply the second power voltage VDDH to the output node n3 of the level shifting unit L, and hence, a current on the basis of the second power voltage VDDH flows to the output node n3. Accordingly, even when the driving ability of the P-type MOS transistor P2 of the level shifting unit L is lowered, the quantity of a current flowing to the output node n3 is increased because the current flowing from the N-type MOS transistor N3 of the automatic delay adjusting circuit 10A is added to a current flowing to the output node n3 through the P-type MOS transistor P2. As a result, the fall delay time of the output signal from the output terminal out is reduced to be substantially equivalent to the rise delay time. Thus, the balance between the delay times can be satisfactorily compensated.

Figure 3:
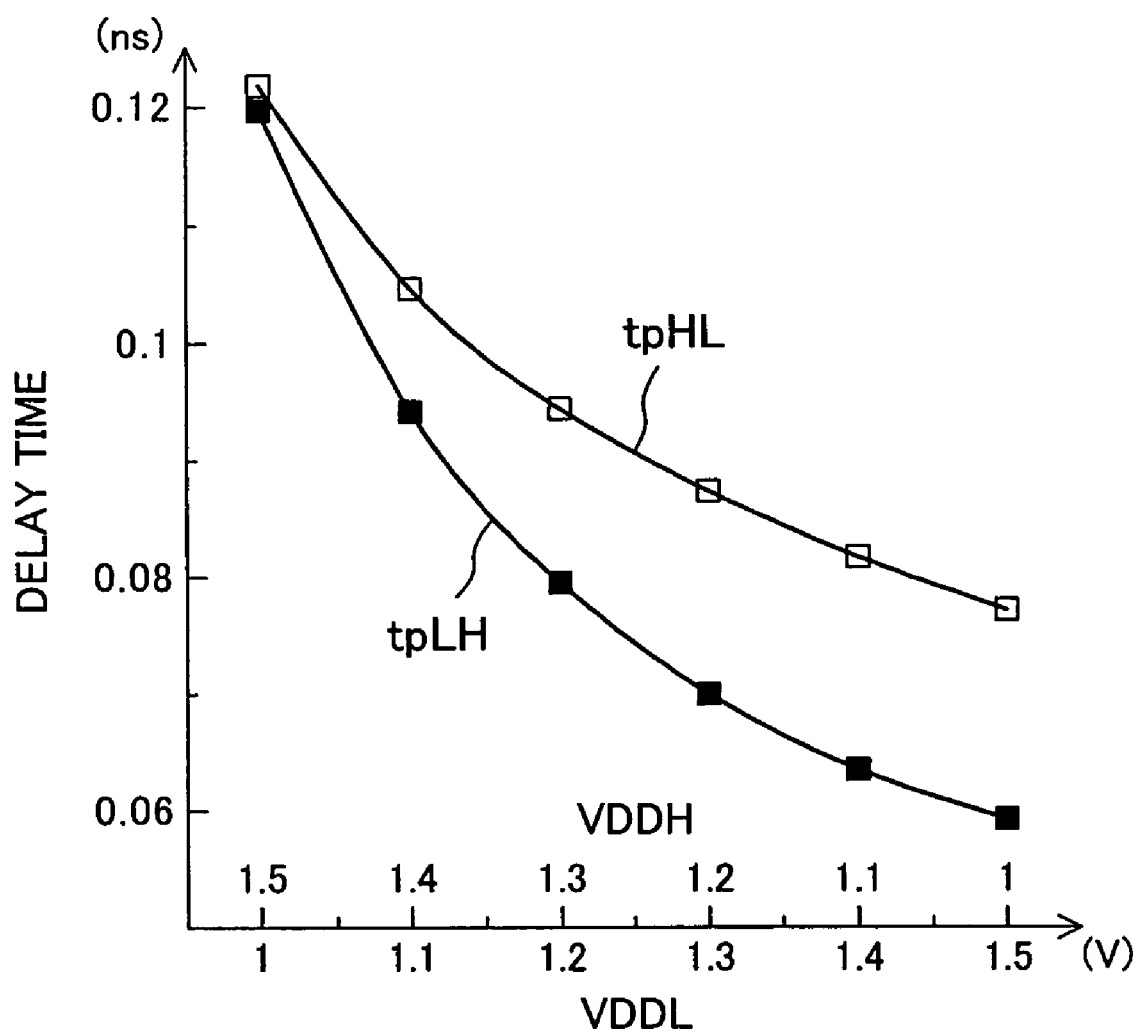
FIG. 3 is a diagram for showing the delay time characteristics of the level shifter of FIG. 2.

FIG. 3 shows the change characteristics of the rise delay time tpLH and the fall delay time tpHL of the output signal obtained when the first and second power voltages VDDL and VDDH are changed in this embodiment. Data shown in FIG. 3 are calculated under the same conditions as those employed for obtaining the characteristic diagram of the conventional level shifter shown in FIG. 17. In the conventional characteristics shown in FIG. 17, when the first and second power voltages VDDL and VDDH are changed, a large time difference is caused between the rise delay time tpLH and the fall delay time tpHL of the output signal and hence the balance is disadvantageously spoiled. In contrast, in this embodiment, the imbalance between the delay times can be suppressed even when the power voltages are changed as shown in FIG. 3.

In this manner, according to this embodiment, even when one or both of the first and second power voltages VDDL and VDDH are changed, the fall delay time tpHL of the output signal can be adjusted to be substantially as short as the rise delay time tpLH, so that the characteristics of these delay times can be well balanced.

Embodiment 2

A level shifter having an automatic delay adjusting function according to Embodiment 2 of the invention will now be described with reference to the accompanying drawings.

Figure 4:
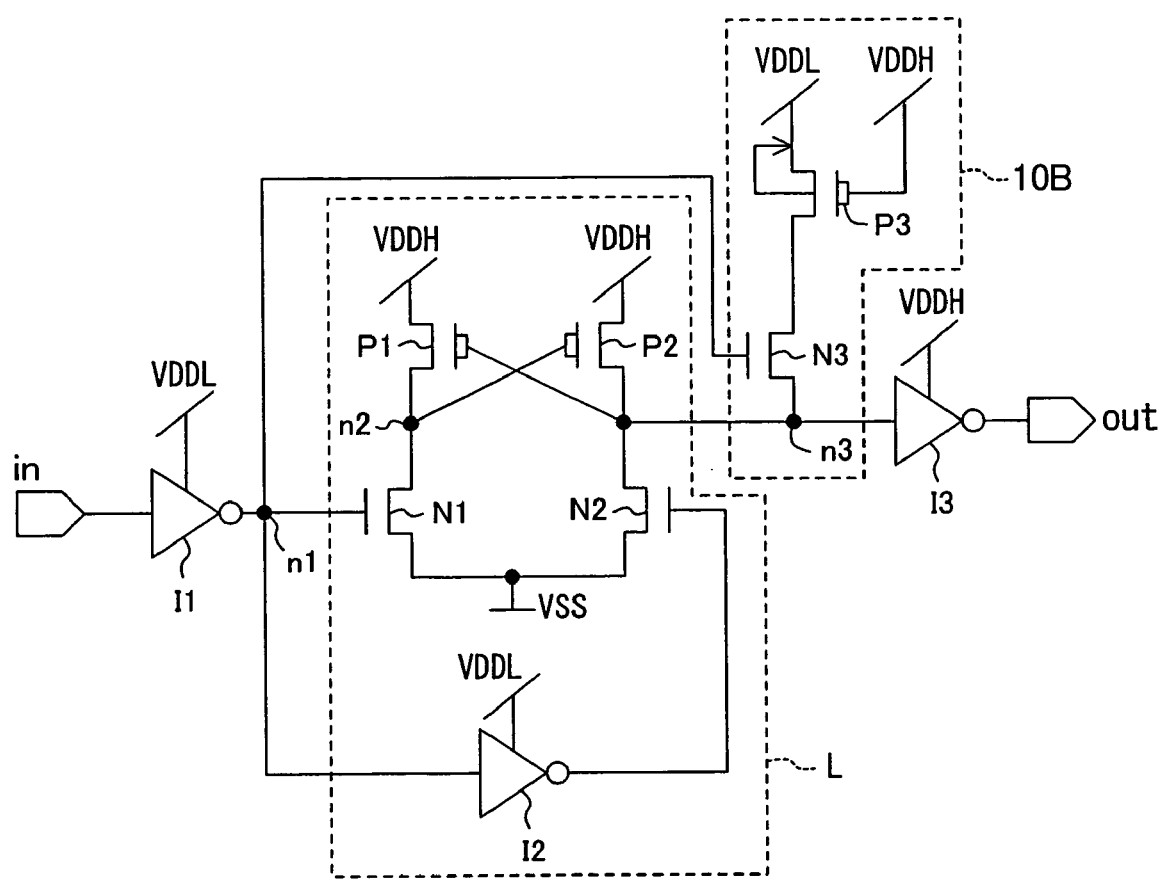
FIG. 4 is a circuit diagram for showing the internal configuration of a level shifter having an automatic delay adjusting function according to Embodiment 2 of the invention.

FIG. 4 is a circuit diagram of the level shifter having the automatic delay adjusting function of this embodiment. The level shifter of FIG. 4 has a basic configuration substantially the same as that of the level shifter of FIG. 2 but is different in an automatic delay adjusting circuit 10B including a P-type MOS transistor P3 in addition to the N-type MOS transistor N3.

In the automatic delay adjusting circuit 10B, the source of the N-type MOS transistor N3 is connected to the output terminal out and the gate thereof is connected to the input node n1 of the level shifting unit L. Furthermore, in the P-type MOS transistor P3, the drain thereof is connected to the drain of the N-type MOS transistor N3, the first power voltage VDDL is supplied to the source thereof and the second power voltage VDDH is supplied to the gate thereof.

For example, in the case where the first power voltage VDDL is higher than the second power voltage VDDH, since the driving ability of the P-type MOS transistor P2 is lower as compared with that of the N-type MOS transistor N2, the fall delay time tpHL of the output signal is increased as compared with the rise delay time tpLH, so as to largely spoil the balance between these delay times. In contrast, in the automatic delay adjusting circuit 10B of this embodiment, the P-type MOS transistor P3 is in an ON state when its gate-source voltage Vgs (=|VDDH−VDDL|) is not lower than its threshold voltage Vth (of, for example, 0.6 V), and the N-type MOS transistor N3 is turned on at the fall of the input signal. Therefore, similarly to the automatic delay adjusting circuit 10A of Embodiment 1, since a current on the basis of the second power voltage VDDH flows to the output node n3, the rise of the signal at the output node n3 is compensated, so as to effectively suppress the increase of the fall delay time tpHL of the output signal.

Moreover, in the automatic delay adjusting circuit 10B, the driving ability of the P-type MOS transistor P3 is changed in accordance with a potential difference between the first power voltage VDDL and the second power voltage VDDH, so that the driving ability of the P-type MOS transistor P3 can be higher as the first power voltage VDDL is higher and the second power voltage VDDH is lower. Accordingly, when these power voltages are under conditions for more largely spoiling the balance between the rise delay time and the fall delay time, the quantity of the current flowing to the output node n3 on the basis of the second power voltage VDDH is larger, and hence, the compensating effect can be advantageously larger.

Figure 5:
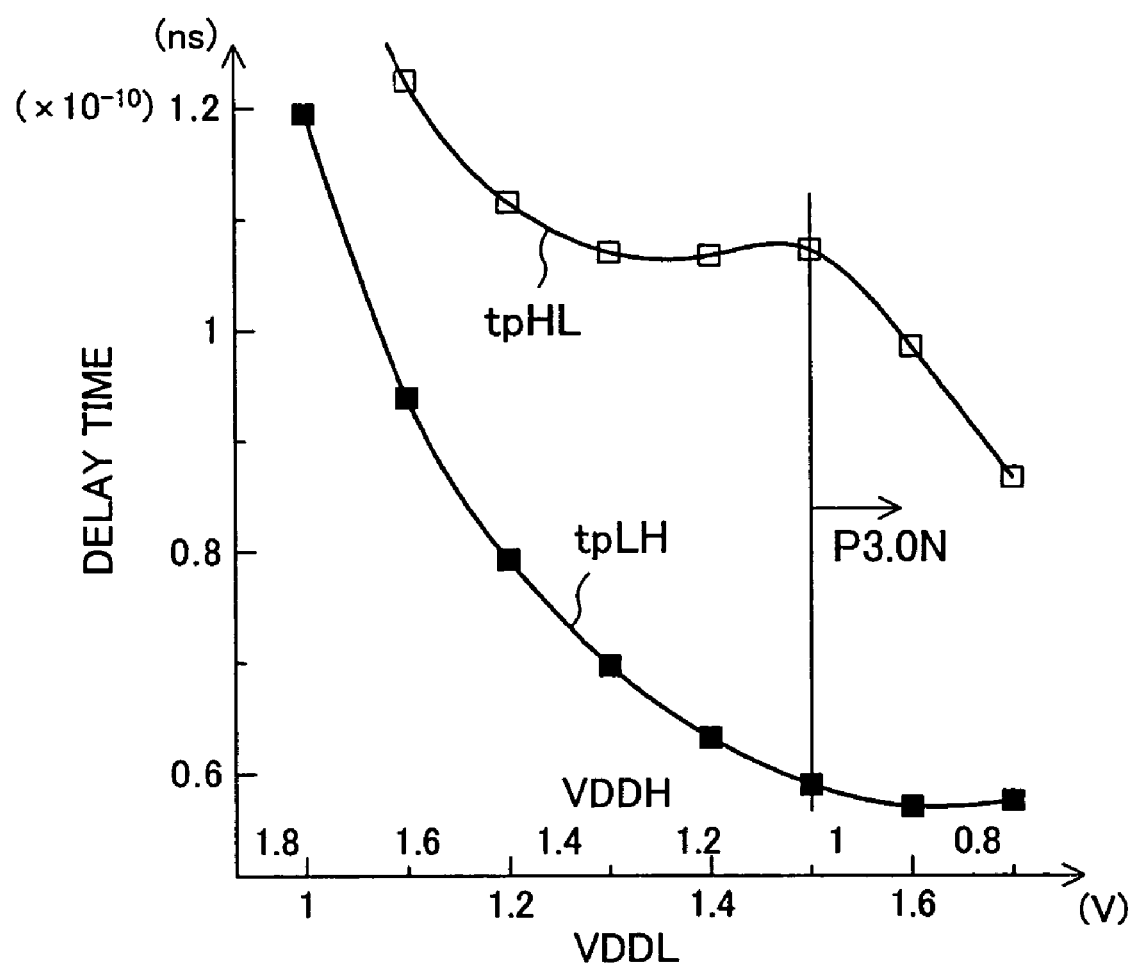
FIG. 5 is a diagram for showing the delay time characteristics of the level shifter of FIG. 4.

In addition, as shown in FIG. 5, in the reverse case where the first power voltage VDDL is lower than the second power voltage VDDH (i.e., |VDDH−VDDL|<Vth), namely, in the case where the balance between the rise and fall delay times of the output signal is satisfactorily kept and there is no need to operate the delay adjusting circuit 10B, the P-type MOS transistor P3 is turned off, so as to automatically stop compensating the rise of the signal at the output node n3 of the level shifting unit L. Accordingly, in the whole level shifter, useless transition of the transistors can be avoided, so as to advantageously reduce the power consumption.

In this manner, according to this embodiment, even when one or both of the first and second power voltages are changed, the balance between the rise and fall delay times of the output signal can be automatically kept, and in addition, the automatic delay adjusting circuit 10B can be automatically stopped when there is no need to adjust the delay times.

Embodiment 3

A level shifter having an automatic delay adjusting function according to Embodiment 3 of the invention will now be described with reference to the accompanying drawing.

Figure 6:
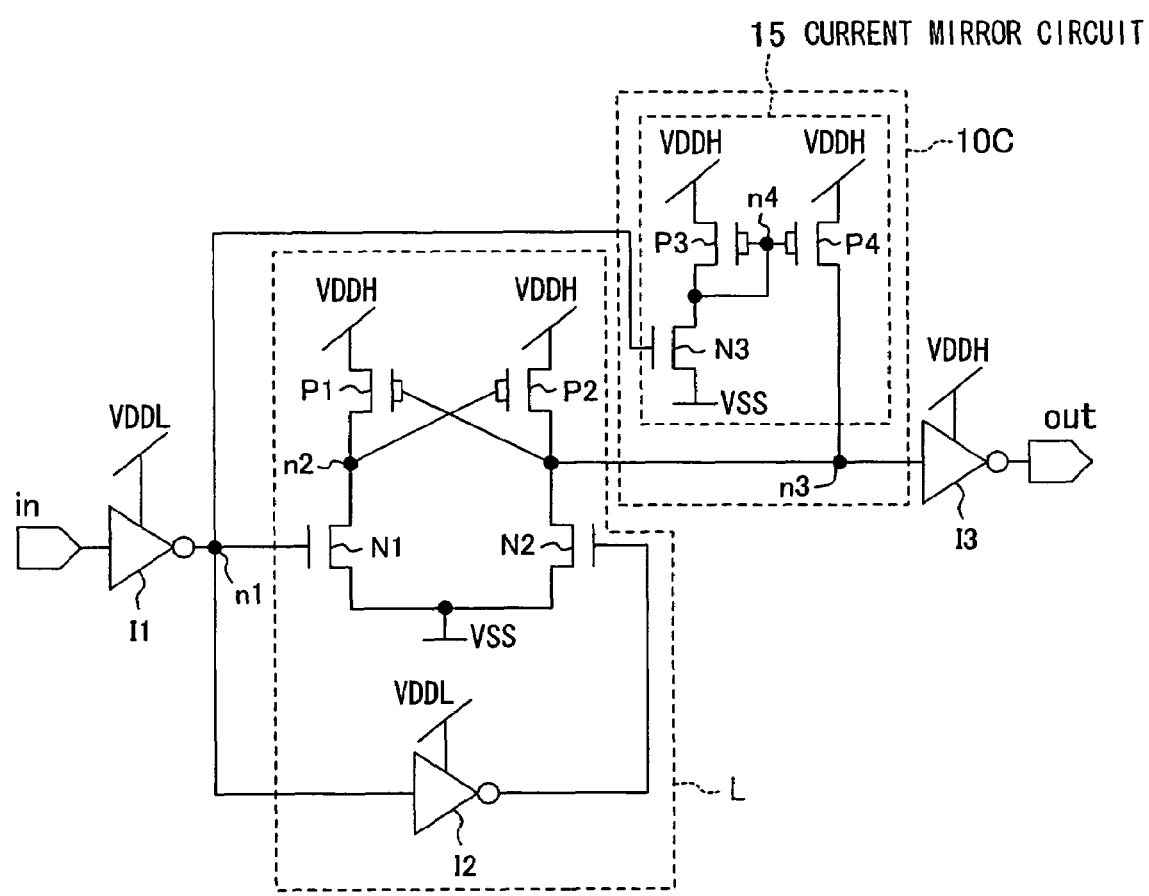
FIG. 6 is a circuit diagram for showing the internal configuration of a level shifter having an automatic delay adjusting function according to Embodiment 3 of the invention.

FIG. 6 is a circuit diagram of the level shifter having the automatic delay adjusting function of this embodiment. The level shifter of FIG. 6 includes a current mirror circuit 15 as an automatic delay adjusting circuit 10C.

The current mirror circuit 15 includes a first N-type MOS transistor N3 and first and second P-type MOS transistors P3 and P4. In the N-type MOS transistor N3, the ground voltage VSS is supplied to the source thereof, the drain thereof is connected to the gates of the first and second P-type MOS transistors P3 and P4 and the gate thereof is connected to the input node n1 of the level shifting unit L. Also, in the first P-type MOS transistor P3, the drain thereof is connected to the drain of the first N-type MOS transistor N3 and the second power voltage VDDH is supplied to the source thereof. Furthermore, in the second P-type MOS transistor P4, the drain thereof is connected to the output node n3 of the level shifting unit L and the second power voltage VDDH is supplied to the source thereof.

For example, in the case where the first power voltage VDDL is higher than the second power voltage VDDH, since the driving ability of the P-type MOS transistor P2 is lower as compared with that of the N-type MOS transistor N2, the fall delay time tpHL is increased as compared with the rise delay time tpLH of the output signal, so as to largely spoil the balance between these delay times as described above. In contrast, in this embodiment, when the input signal falls, the N-type MOS transistor N3 is turned on in the current mirror circuit 15, and hence the P-type MOS transistors P3 and P4 are also turned on. Therefore, a current on the basis of the second power voltage VDDH flows to the output node n3 of the level shifting unit L through the P-type MOS transistor P4, so as to compensate the rise of the signal at the output node n3. As a result, the increase of the fall delay time tpHL of the output signal from the output terminal out can be effectively suppressed, so as to satisfactorily keep the balance between the rise delay time tpLH and the fall delay time tpHL.

At this point, since the current for compensation is supplied through the P-type MOS transistor P4 of the current mirror circuit 15, the quantity of the supplied current on the basis of the second power voltage VDDH can be larger as compared with the case where the current is supplied through an N-type MOS transistor. Therefore, the increase of the fall delay time tpHL can be more effectively suppressed.

On the other hand, in the case where the input signal rises, the signal at the output node n3 of the level shifter unit L falls. However, when the N-type MOS transistor N3 of the current mirror circuit 15 is turned off, the potential at a node n4 of the current mirror circuit 15 (corresponding to the gates of the first and second P-type MOS transistors P3 and P4) is increased owing to the drive of the P-type MOS transistor P3, so as to turn off the P-type MOS transistor P4. As a result, the supply of the current for the compensation through the current mirror circuit 15 is stopped.

Embodiment 4

A level shifter having an automatic delay adjusting function according to Embodiment 4 of the invention will now be described with reference to the accompanying drawing.

Figure 7:
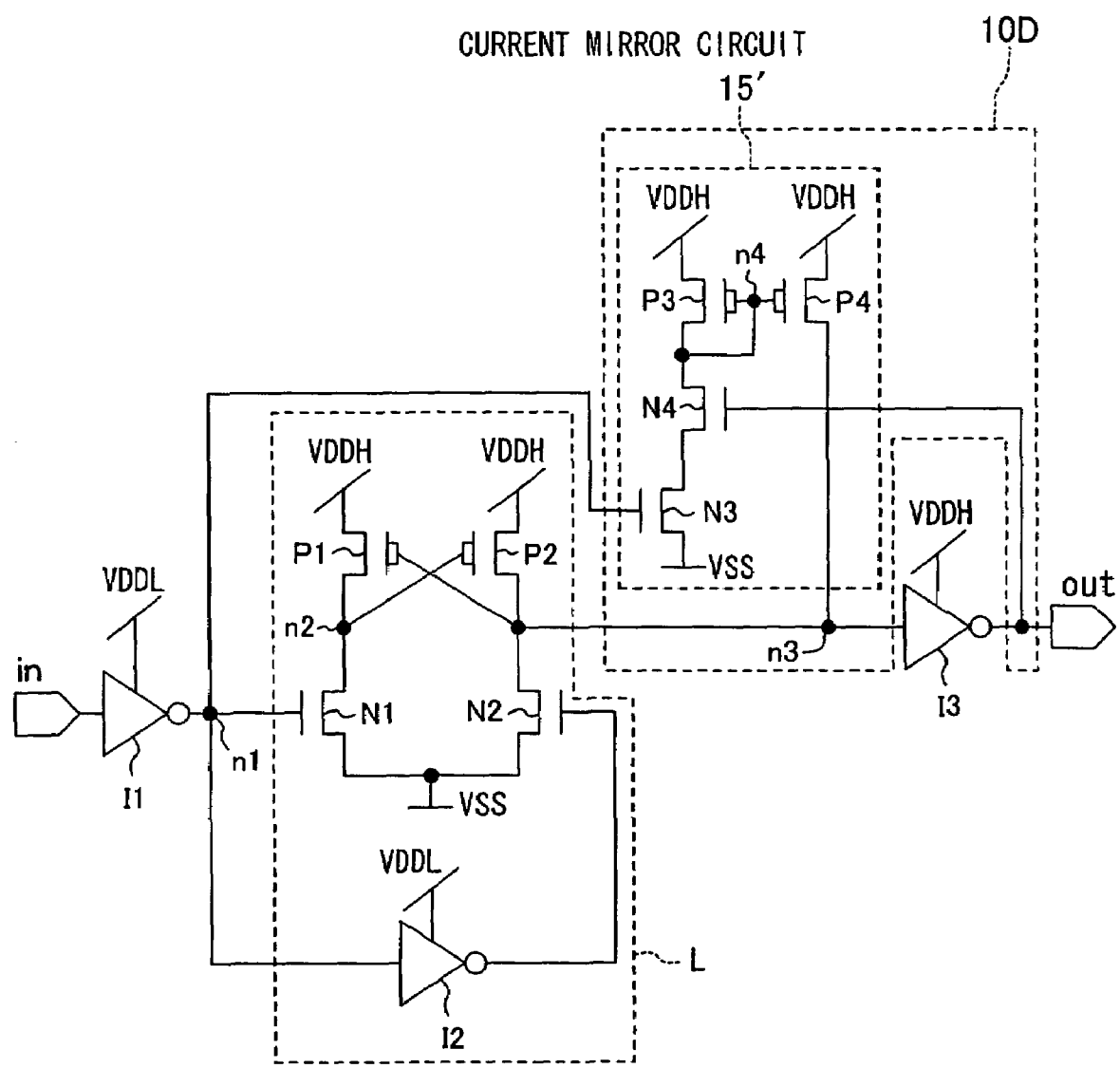
FIG. 7 is a circuit diagram for showing the internal configuration of a level shifter having an automatic delay adjusting function according to Embodiment 4 of the invention.

FIG. 7 is a circuit diagram of the level shifter having the automatic delay adjusting function of this embodiment. As a characteristic of the level shifter of FIG. 7, a current mirror circuit 15' obtained by additionally providing a second N-type MOS transistor N4 to the current mirror circuit 15 working as the automatic delay adjusting circuit 10C shown in FIG. 6 is provided as an automatic delay adjusting circuit 10D.

The second N-type MOS transistor N4 is disposed between the first N-type MOS transistor N3 and the first P-type MOS transistor P3, and the source thereof is connected to the drain of the first N-type MOS transistor N3, the drain thereof is connected to the drain of the first P-type MOS transistor P3 and the gate thereof is connected between the third inverter I3 and the output terminal out.

In this embodiment, before the input signal falls, namely, when the input signal is at the level of the first power voltage VDDL, the second N-type MOS transistor N4 of the current mirror circuit 15' is in an ON state because the output signal from the output terminal out is at the level of the second power voltage VDDH. Thereafter, when the input signal falls, as described in Embodiment 3, the first N-type MOS transistor N3 and the first and second P-type MOS transistors P3 and P4 are turned on in the current mirror circuit 15', and hence, a current on the basis of the second power voltage VDDH is supplied through the P-type MOS transistor P4 to the output node n3 of the level shifting unit L, so as to compensate the rise of the signal at the output node n3 (namely, the fall of the output signal).

Then, when the output node n3 of the level shifting unit L undergoes a transition to H level (i.e., the second power voltage VDDH), the N-type MOS transistor N4 of the current mirror circuit 15' is turned off, and therefore, a potential at the node n4 is immediately increased owing to the drive of the P-type MOS transistor P3 in the current mirror circuit 15', so as to turn off the P-type MOS transistor P4. As a result, the current supply for the compensation to the output node n3 of the level shifting unit L by the current mirror circuit 15' is stopped.

In this manner, the level shifter of this embodiment includes a feedback circuit for automatically controlling the operation and the non-operation of the automatic delay adjusting circuit 10D even when the first and second power voltages are changed. Accordingly, not only the balance in the delay characteristics between the rise delay time and the fall delay time of the output signal is satisfactorily kept but also efficient balance adjustment can be realized.

Embodiment 5

A level shifter having an automatic delay adjusting function according to Embodiment 5 of the invention will now be described with reference to the accompanying drawings.

Figure 8:
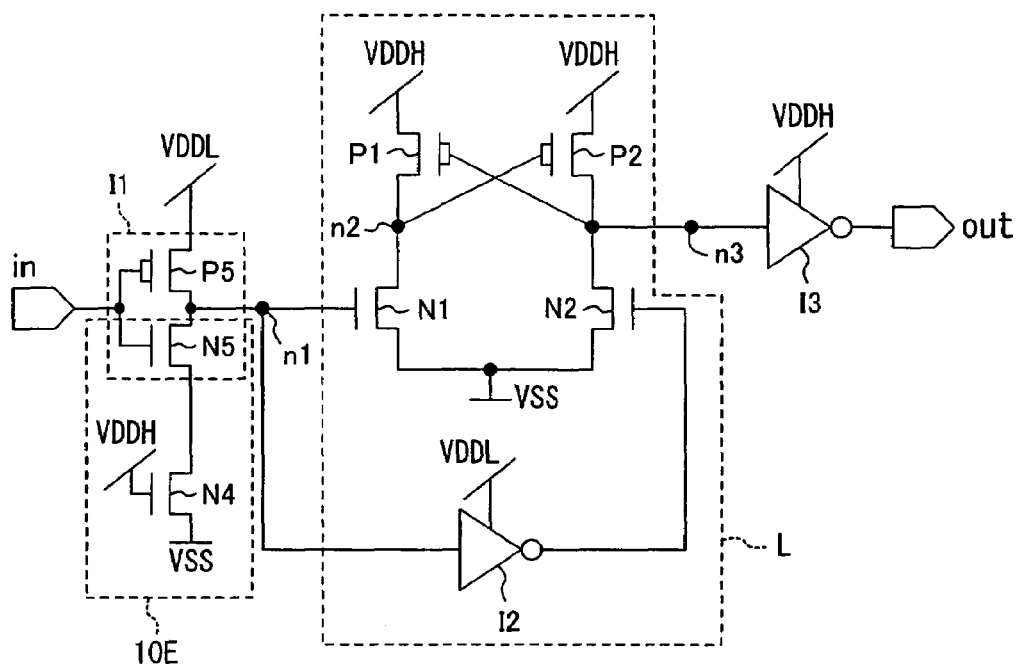
FIG. 8 is a circuit diagram for showing the internal configuration of a level shifter having an automatic delay adjusting function according to Embodiment 5 of the invention.

FIG. 8 is a circuit diagram of the level shifter having the automatic delay adjusting function of this embodiment. In the level shifter of FIG. 8, an automatic delay adjusting circuit 10E is disposed on the side of the input node n1 of the level shifting unit L.

The automatic delay adjusting circuit 10E includes an N-type MOS transistor N5, which is serially connected to a P-type MOS transistor P5 so as to together construct a first inverter I1, and a second N-type MOS transistor N4 serially connected to the first N-type MOS transistor (first N-type transistor) N5. The gate of the first N-type MOS transistor N5 is connected to the input terminal in and the drain thereof is connected to the input node n1 of the level shifting unit L. Also, in the second N-type MOS transistor N4, the ground voltage VSS is supplied to the source thereof, the drain thereof is connected to the source of the first N-type MOS transistor N5 and the second power voltage VDDH is supplied to the gate thereof.

Figure 9:
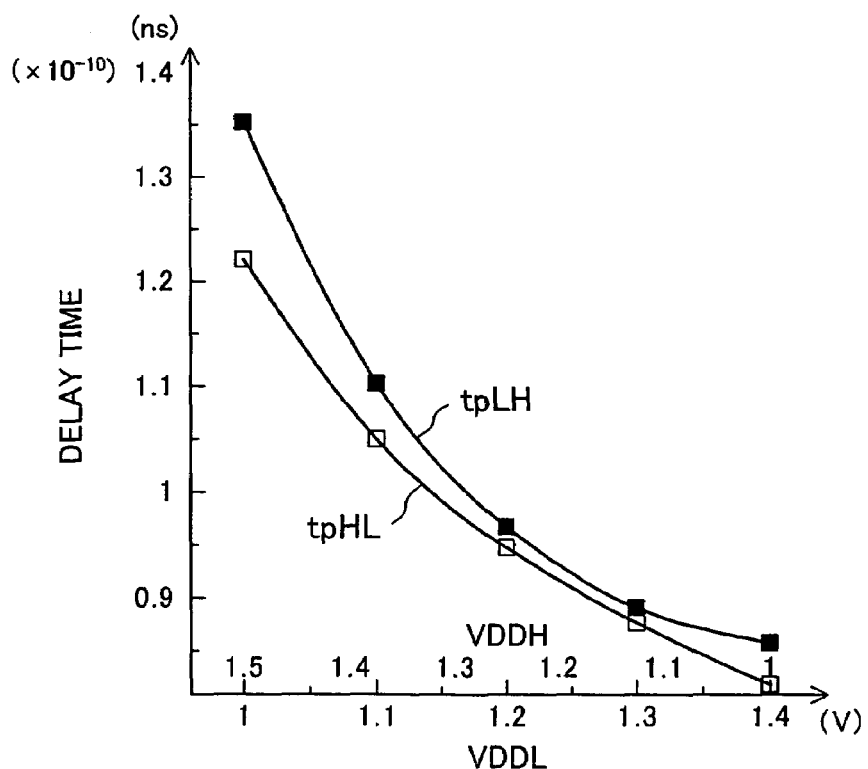
FIG. 9 is a diagram for showing the delay time characteristics of the level shifter of FIG. 8.

In this embodiment, in the case where the first power voltage VDDL is set to a high voltage and the second power voltage VDDH is set to a low voltage, the fall delay time tpHL of the output signal becomes longer than the rise delay time tpLH so that the time difference therebetween is increased as is understood from FIG. 3. However, as the second power voltage VDDH is set to a lower voltage, the driving ability of the N-type MOS transistor N4 of the automatic delay adjusting circuit 10E is further lower. Accordingly, at the rise of the input signal, even though the N-type MOS transistor N5 of the first inverter I1 is turned on with general driving ability, reduction of a current flowing from the input node n1 of the level shifting unit L to the ground is made smaller by the N-type MOS transistor N4 of the automatic delay adjusting circuit 10E, and hence, lowering of the voltage at the input node n1 of the level shifting unit L is made smaller. Therefore, the fall delay time at the input node n1 is increased. As a result, as shown in FIG. 9, the fall delay time at the output node n3 is increased in the level shifting unit L, so as to also increase the rise delay time tpLH of the output signal from the output terminal out. Accordingly, both the rise delay time tpLH and the fall delay time tpHL are adjusted to be longer, so as to satisfactorily compensate the balance between the delay times tpLH and tpHL.

Embodiment 6

A level shifter having an automatic delay adjusting function according to Embodiment 6 of the invention will now be described with reference to FIG. 10.

The level shifter of this embodiment is obtained by combining Embodiment 1 shown in FIG. 2 and Embodiment 5 shown in FIG. 8.

Figure 10:
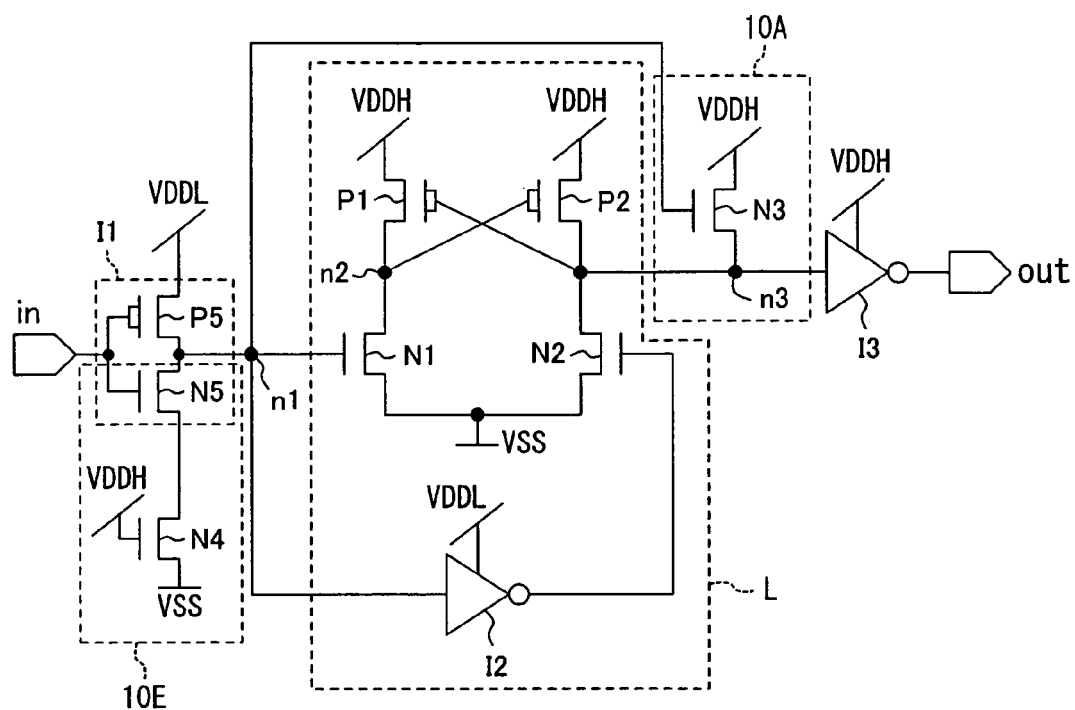
FIG. 10 is a circuit diagram for showing the internal configuration of a level shifter having an automatic delay adjusting function according to Embodiment 6 of the invention.

Specifically, the level shifter of FIG. 10 includes two automatic delay adjusting circuits 10A and 10E. One automatic delay adjusting circuit 10A includes the N-type MOS transistor N3 connected to the output node n3 of the level shifting unit L and operated in accordance with potential at the input node n1 of the level shifting unit L. The other automatic delay adjusting circuit 10E includes the second N-type MOS transistor N4 serially connected to the N-type MOS transistor (first transistor) N5 of the first inverter I1.

Accordingly, in this embodiment, an effect resulting from the combination of Embodiment 1 and Embodiment 5 can be attained. Specifically, the fall delay time tpHL of the output signal is adjusted to be shorter by the automatic delay adjusting circuit 10A, and the rise delay time tpLH of the output signal is adjusted to be longer by the automatic delay adjusting circuit 10E, so that the balance between these delay times tpHL and tpLH can be kept at the substantially intermediate delay time.

Embodiment 7

A level shifter having an automatic delay adjusting function according to Embodiment 7 of the invention will now be described with reference to FIG. 11.

Figure 11:
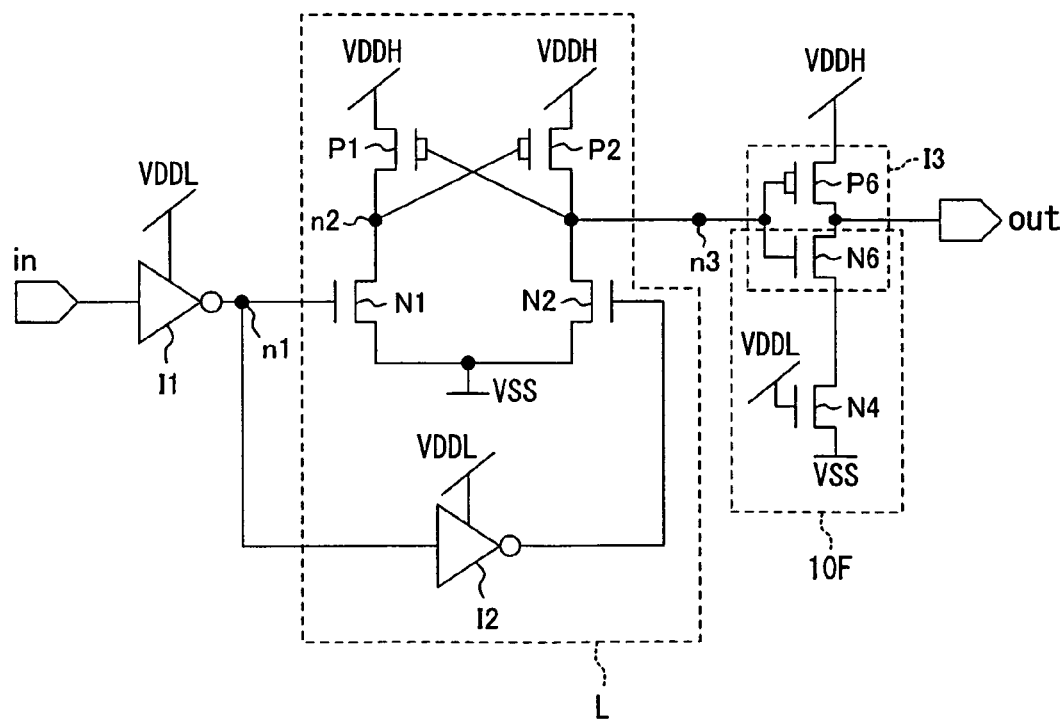
FIG. 11 is a circuit diagram for showing the internal configuration of a level shifter having an automatic delay adjusting function according to Embodiment 7 of the invention.

The level shifter of FIG. 11 is obtained by changing the position of the automatic delay adjusting circuit 10E of Embodiment 5 shown in FIG. 8. Specifically, in this embodiment, an automatic delay adjusting circuit 10F is disposed on the side of the output node n3 of the level shifting unit L. The automatic delay adjusting circuit 10F includes serially connected first and second N-type MOS transistors N6 and N4 similarly to the automatic delay adjusting circuit 10E of FIG. 8, and the first N-type MOS transistor N6 also works as the N-type MOS transistor N6 serially connected to a P-type MOS transistor P6 so as to together construct a third inverter I3. The gate of the first N-type MOS transistor N6 is connected to the output node n3 of the level shifting unit L, the drain thereof is connected to the output terminal out and the source thereof is connected to the drain of the second N-type MOS transistor N4. Also, the first power voltage VDDL is supplied to the gate of the second N-type MOS transistor N4.

Accordingly, in the case where the first power voltage VDDL is set to a high voltage and the second power voltage VDDH is set to a low voltage, the fall delay time tpHL of the output signal is longer than the rise delay time tpHL so that the time difference therebetween is increased as is understood from FIG. 3. However, in this embodiment, as the first power voltage VDDL is set to a higher voltage, the driving ability of the N-type MOS transistor N4 of the automatic delay adjusting circuit 10F becomes higher. Accordingly, at the fall of the input signal, even though the rise of the signal at the output node n3 of the level shifting unit L is delayed due to the lowering of the driving ability of the P-type MOS transistor P2, the quantity of a current flowing from the output terminal out to the ground is increased by the N-type MOS transistor N4 of the automatic delay adjusting circuit 10F, so that the lowering of the voltage at the output terminal out can be made larger. Therefore, the fall delay time tpHL of the signal from the output terminal out is reduced. As a result, even when the rise delay time tpLH is short, the fall delay time tpHL is adjusted to be short, so as to satisfactorily compensate the balance between these delay times tpLH and tpHL.

Embodiment 8

A level shifter having an automatic delay adjusting function according to Embodiment 8 of the invention will now be described with reference to the accompanying drawing.

Figure 12:
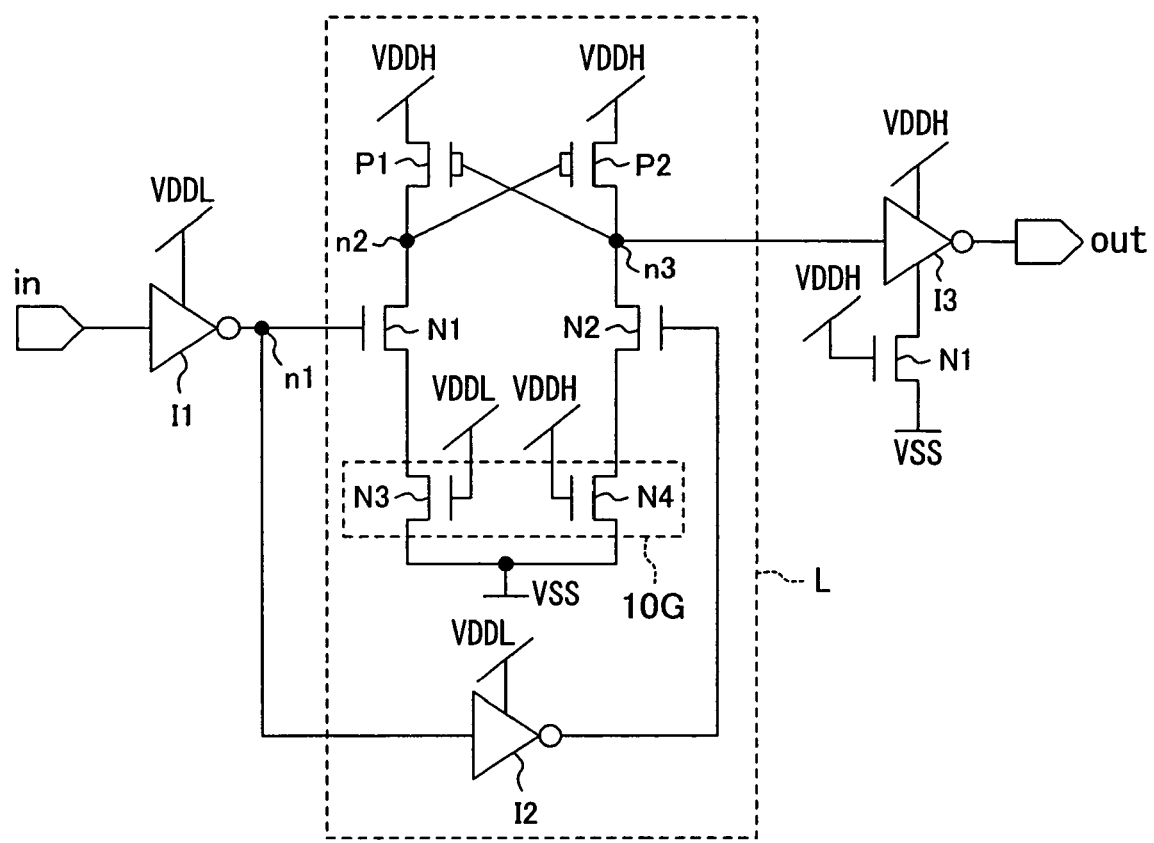
FIG. 12 is a circuit diagram for showing the internal configuration of a level shifter having an automatic delay adjusting function according to Embodiment 8 of the invention.

FIG. 12 is a circuit diagram of the level shifter having the automatic delay adjusting function of this embodiment. In the level shifter of FIG. 12, in the case where a level shifting unit L is a cross latch type shifter including first and second P-type MOS transistors P1 and P2, third and fourth N-type MOS transistors N1 and N2 and a second inverter I2, an automatic delay adjusting circuit 10G includes a fifth N-type MOS transistor N4 and a sixth N-type MOS transistor N3.

In the automatic delay adjusting circuit 10G, the fifth N-type MOS transistor N4 is serially connected to the fourth N-type MOS transistor N2 of the level shifting unit L, the drain thereof is connected to the source of the fourth N-type MOS transistor N2, the ground voltage VSS is supplied to the source thereof and the second power voltage VDDH is supplied to the gate thereof. Furthermore, the sixth N-type MOS transistor N3 is serially connected to the third N-type MOS transistor N1 of the level shifting unit L, the drain thereof is connected to the source of the third N-type MOS transistor N1, the ground voltage VSS is supplied to the source thereof and the first power voltage VDDL is supplied to the gate thereof.

For example, in the case where the first power voltage VDDL is higher than the second power voltage VDDH, the driving ability of the P-type MOS transistor P2 is lower as compared with that of the N-type MOS transistor N2 of the level shifting unit L, and hence, the rise delay time of the signal at the output node n3 becomes longer than the fall delay time. In contrast, according to this embodiment, in the automatic delay adjusting circuit 10G, the driving ability of the fifth N-type MOS transistor N4 is suppressed as compared with that of the sixth N-type MOS transistor N3. Therefore, the fall delay time at the output node n3 of the level shifting unit L becomes longer than the rise delay time.

Accordingly, in this embodiment, the lowering of the driving ability of the P-type MOS transistor P2 of the level shifting unit L and the forced suppression of the driving ability of the fifth N-type MOS transistor N4 can be compared favorably with each other. As a result, the rise delay time tpLH of the output signal from the output terminal out tends to be substantially equal to the fall delay time tpHL, so that the rise and fall delay times can be well balanced.

(First Related Art of the Invention)

A level shifter according to related art of the invention will now be described with reference to the accompanying drawing.

Figure 13:
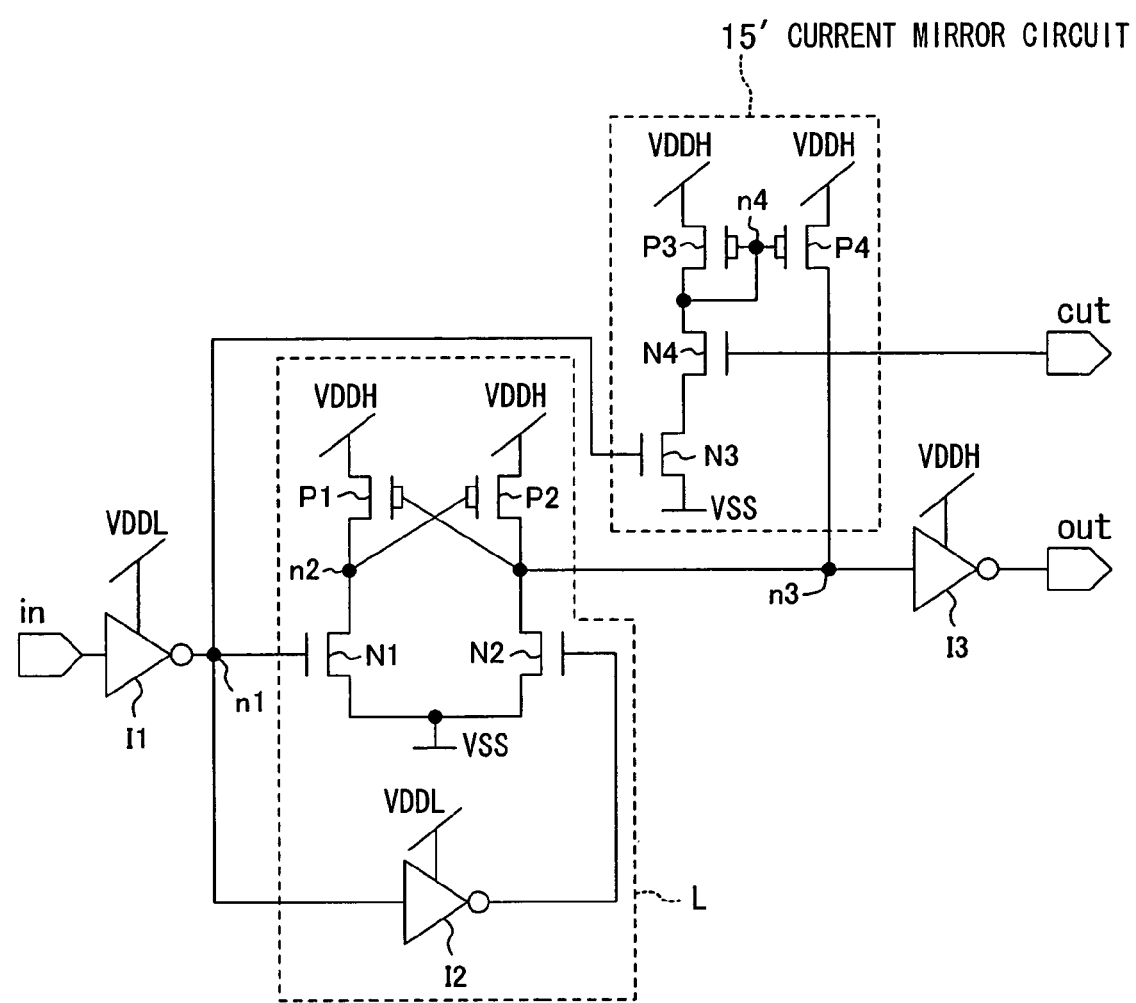
FIG. 13 is a circuit diagram for showing the internal configuration of a level shifter having a delay adjusting function according to an embodiment of the invention.

FIG. 13 is a circuit diagram of a level shifter of the related art. In the level shifter of FIG. 13, the gate of the N-type MOS transistor N4, which is serially connected between the drain of the P-type MOS transistor P3 and the drain of the N-type MOS transistor N3 in the current mirror circuit 15' of the level shifter shown in FIG. 7, is connected not to the output terminal out but to a control terminal cnt, so that the N-type MOS transistor N4 can be controlled by externally supplying a control signal through the control terminal cnt.

For example, in the case where the first power voltage VDDL is higher than the second power voltage VDDH, the driving ability of the P-type MOS transistor P2 is lower as compared with that of the N-type MOS transistor N2 in the level shifting unit L, and hence, the fall delay time of the output signal is increased as compared with the rise delay time, so as to largely spoil the balance between these delay times. According to this related art, however, when the balance is largely spoiled, a control signal at H (high) level is applied to the control terminal cnt so as to place the N-type MOS transistor N4 always in an ON state, and the N-type MOS transistor N3 is turned on at the fall of the input signal. Thus, the rise of the signal at the output node n3 of the level shifting unit L is compensated so as to suppress the increase of the fall delay time of the output signal. Alternatively, in the case where the first power voltage VDDL is lower than the second power voltage VDDH, since there is no need to use the function to adjust the delay times, a control signal at L level is applied to the control terminal cnt so as to place the N-type MOS transistor N4 always in an OFF state. Thus, the function to adjust the delay times can be disabled, and hence, useless transition of the transistors can be avoided in the whole level shifter, resulting in advantageously reducing the power consumption.

In this manner, according to this related art, when the power voltages are changed, the delay adjusting function is performed not automatically but can be selected to perform or not by inputting a control signal from the control terminal cnt. Thus, not only the balance between the rise delay time and the fall delay time of the output signal can be satisfactorily kept but also efficient balance adjustment can be realized.

(Second Related Art of the Invention)

A level shifter according to second related art of the invention will now be described with reference to the accompanying drawing.

Figure 14:
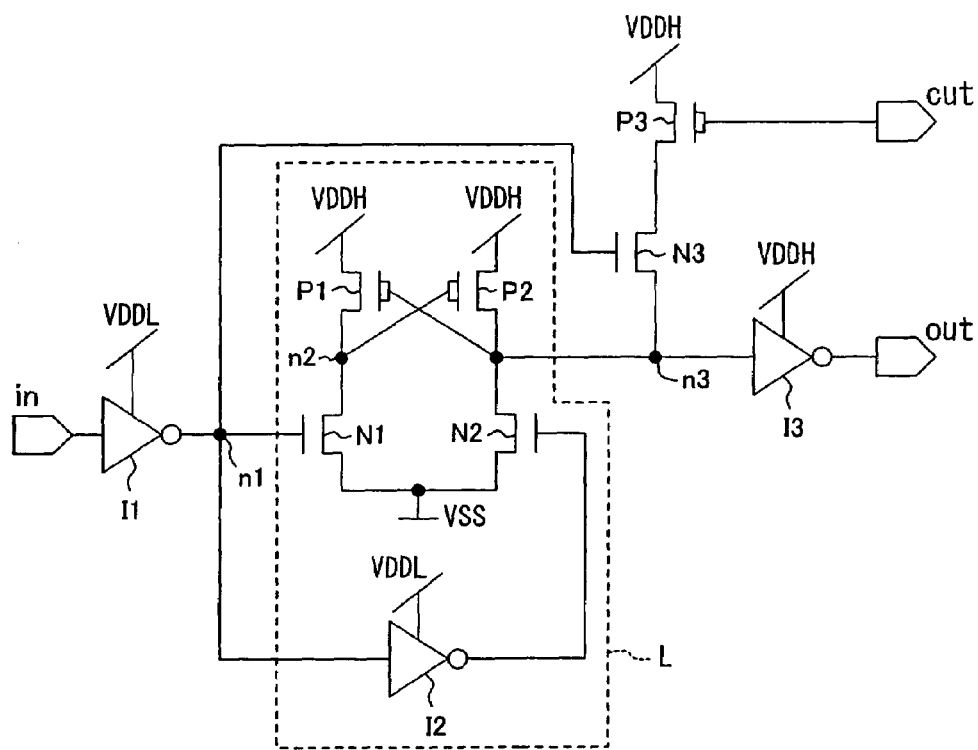
FIG. 14 is a circuit diagram for showing the internal configuration of a level shifter having a delay adjusting function according to an embodiment of the invention.
Figure 14:
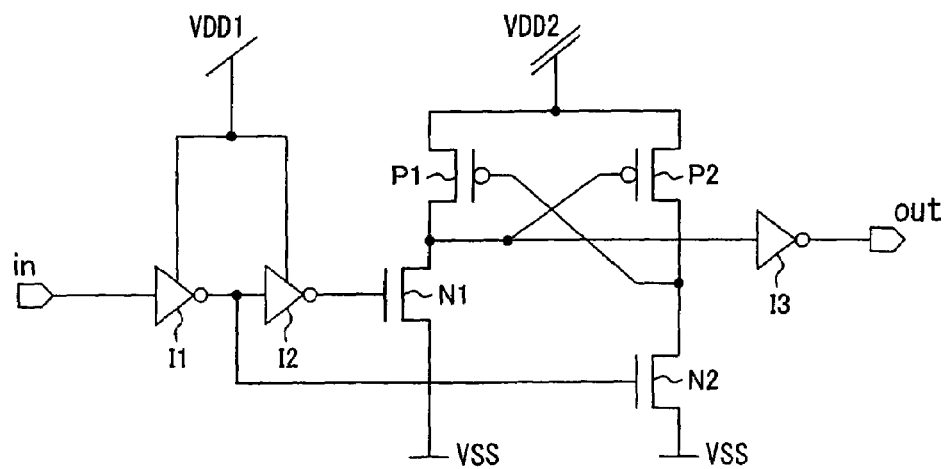

FIG. 14 is a circuit diagram of the level shifter according to the related art. In the level shifter of FIG. 14, the gate of the P-type MOS transistor P3 of the automatic delay adjusting circuit 10B, which accepts the second power voltage VDDH in the level shifter of Embodiment 2 shown in FIG. 4, is connected to a control terminal cnt instead of supplying the second power voltage VDDH, so that the P-type MOS transistor P3 can be controlled by externally supplying a control signal through the control terminal cnt.

For example, in the case where the first power voltage VDDL is higher than the second power voltage VDDH, the fall delay time of the output signal is increased as compared with the rise delay time, so as to largely spoil the balance between these delay times as described above. According to this related art, however, merely when the balance is largely spoiled, a control signal at L level is applied to the control terminal cnt so as place the P-type MOS transistor P3 always in an ON state, and the N-type MOS transistor N3 is turned on at the fall of the input signal. Thus, the rise of the signal at the output node n3 of the level shifting unit L is compensated so as to suppress the increase of the fall delay time of the output signal. Alternatively, in the case where the first power voltage VDDL is lower than the second power voltage VDDH, since there is no need to use the function to adjust the delay times, a control signal at H level is applied to the control terminal cnt so as to place the P-type MOS transistor P3 always in an OFF state. Thus, the function to adjust the delay times can be disabled, and hence, useless transition of the transistors can be avoided in the whole level shifter, resulting in advantageously reducing the power consumption.

As described above with respect to the related arts, in the case where a control terminal having a function to select connection/disconnection of the compensating current flowing through the semiconductor device in accordance with a control signal when the function to adjust the delay times is desired to exhibit is additionally provided in each of the above-described embodiments, the function to adjust the delay times can be selectively employed in accordance with the control signal supplied through the control terminal even if the power voltages are changed. In this manner, the delay characteristics of the rise delay time and the fall delay time of the output signal can be well balanced and efficient balance adjustment can be realized.

The aforementioned related arts are applicable to the case where the rise delay time and the fall delay time are required to be ill balanced depending upon conditions and applications. Therefore, the balance between the rise and fall delay times of the output signal can be widely adjusted if necessary.

What is claimed is:

1. A level shifter comprising:
a first P-type transistor for receiving a first power supply voltage, a drain of the first P-type transistor electrically connected to a first node, wherein a gate terminal of the first P-type transistor receives an input signal;
first and second N-type transistors serially connected to the first node, wherein a gate terminal of the first N-type transistor receives the input signal; a source of the second N-type transistor receives a reference voltage; and a gate terminal of the second N-type transistor receives a second power supply voltage;
a first inverter receiving a signal supplied via the first node and outputting an inverted signal of the signal supplied via the first node in response to a voltage difference between the first power supply voltage and the reference voltage;
a second P-type transistor for receiving the second power supply voltage, a drain of the second P-type transistor electrically connected to a second node and a third N-type transistor for receiving the reference voltage, a drain of the third N-type transistor electrically connected to the second node, wherein a gate terminal of the second P-type transistor is electrically connected to a third node and a gate terminal of the third N-type transistor is electrically connected to the first node;
a third P-type transistor for receiving the second power supply voltage, a drain of the third P-type transistor electrically connected to the third node and a fourth N-type transistor for receiving the reference voltage, a drain of the fourth N-type transistor electrically connected to the third node, wherein a gate terminal of the third P-type transistor is electrically connected to the second node and a gate terminal of the fourth N-type transistor receives the inverted signal output by the first inverter; and a second inverter receiving a signal supplied via the third node and outputting an inverted signal of the signal supplied via the third node in response to a voltage difference between the second power supply voltage and the reference voltage as an output signal.

2. The level shifter of claim 1, further comprising:

a fifth N-type transistor for receiving the second power supply voltage, a drain of the fifth N-type transistor electrically connected to the third node, wherein a gate terminal of the fifth N-type transistor is electrically connected to the first node.

* * * * *